United States Patent [19]

Ritter et al.

[11] 4,210,951
[45] Jul. 1, 1980

[54] APPARATUS FOR HOUSING ELECTRICAL COMPONENTS

[75] Inventors: Peter Ritter; Dieter Fahrenkrog-Petersen, both of Berlin, Fed. Rep. of Germany

[73] Assignee: Siemens Aktiengesellschaft, Munich, Fed. Rep. of Germany

[21] Appl. No.: 929,944

[22] Filed: Aug. 1, 1978

[30] Foreign Application Priority Data

Aug. 11, 1977 [DE] Fed. Rep. of Germany ....... 2736546

[51] Int. Cl.² .............................................. H02B 1/02
[52] U.S. Cl. .................................. 361/391; 361/395; 361/415
[58] Field of Search ............... 361/395, 399, 391, 415; 200/50 A; 179/52 S

[56] References Cited

U.S. PATENT DOCUMENTS

| | | | |
|---|---|---|---|
| 1,786,746 | 12/1930 | Gibbs | 200/50 A |
| 2,439,708 | 4/1948 | Abraham | 200/50 A |
| 2,465,078 | 3/1949 | Fitzgerald | 200/50 A |
| 3,569,788 | 3/1971 | Niblack | 391/391 |
| 3,821,609 | 6/1974 | Weber | 361/415 |
| 3,845,253 | 10/1974 | Hanneman et al. | 361/391 |

FOREIGN PATENT DOCUMENTS 7022422 9/1970 Fed. Rep. of Germany.

*Primary Examiner*—David Smith, Jr.
*Attorney, Agent, or Firm*—Kenyon & Kenyon

[57] ABSTRACT

Apparatus for housing electrical components is disclosed. The apparatus comprises a housing in which are secured a mounting member and at least one circuit board. Components are mounted on the mounting member and circuit board externally of the housing. Thereafter, the mounting member is fastened and the circuit board inserted in the housing. Mating contacts are provided on the mounting member and the circuit board to electrically connect components on the board to components on the mounting member. A protective switch is provided to automatically disconnect an input to the electrical components upon at least partial disassembly of the apparatus. The mounting member is disclosed to be a U-shaped plate one leg of which forms a part of the front panel of the apparatus. Another plate is provided secured to the circuit board and forms the remainder of the front panel when the board is inserted in the housing.

13 Claims, 2 Drawing Figures

APPARATUS FOR HOUSING ELECTRICAL COMPONENTS

BACKGROUND OF THE INVENTION

The present invention relates to apparatus for housing electrical components therein and particularly to such an apparatus which also houses therein at least one circuit board having electrical components thereon.

In known apparatus for housing electrical components, as for example in Federal Republic of Germany Utility Model Pat. No. 7,022,422, a housing is provided which is subdivided into two parts by a partition. Electrical components such as control switches and indicating instruments and components are directly mounted, usually permanently, in one sub-divided part of the housing. Guide elements for guiding a circuit board having additional components mounted thereon are provided in the other sub-divided part of the housing.

Considerable effort and labor are required to assemble the housing of such an apparatus with the components therein at a considerable expense. Providing a separate partition in the housing is one reason for this. The permanent individual mounting of electrical components in the housing, which requires the use of fastening elements, is another reason. Additionally, the fastening of electrical components directly in the housing is time consuming because of a lack of accessibility.

SUMMARY OF THE INVENTION

It is therefore an object of the present invention to provide apparatus for housing therein individual components using a minimum number of elements while permitting simple assembly.

It is also an object of the present invention to provide apparatus for housing individual components which are mounted on elements including circuit boards on which the components may be assembled externally of the housing.

It is another object of the present invention to include in apparatus of the type described in the foregoing objects of the present invention means for automatically disconnecting an input to the apparatus upon at least partial disassembly thereof.

These and other objects are achieved according to the present invention by mounting the electrical components on elements which are thereafter mounted in a housing. Switch means are provided in accordance with the invention which are activated by the disassembly of at least part of the housing to disconnect an input to the components in the housing.

In accordance with the invention, apparatus is provided for housing electrical components comprising a housing having opposed ends with a first of the ends having an opening therein, guide means disposed in the housing for guiding at least one circuit board inserted through the opening, a mounting member retained within the housing adapted to receive electrical components to be mounted thereon, at least one circuit board removably insertable in the housing in cooperation with the guide means, and electrical contact means mounted on the mounting member and the circuit board which mate upon insertion of the circuit board in the housing. Components are mounted on the circuit board and the mounting member externally of the housing. As a result, essentially all electrical components to be housed in the housing may be mounted externally thereof. The mounting member is preferably removably retained by, for example, fastening means, to permit removal of the mounting member to facilitate servicing. Preferably, electrical terminals are provided on the mounting member to facilitate wiring.

The mounting member is disclosed to comprise a generally U-shaped plate having first and second opposed legs and a central portion connecting the legs with the plate being retained in the housing with the second leg thereof proximate the second end of said housing. The electrical contact means is disclosed to comprise first and second mating contact means. The first contact means being mounted on the circuit board proximate one end thereof and the second contact means being mounted on the second leg of the plate.

According to one aspect of the invention, the first end of the housing has a recess extending about the opening therein which receives in a portion thereof the first leg of the plate. The circuit board includes a plate mounted on an end thereof opposed to the end of the circuit board to which the first contact means are mounted and the recess receives in the remaining portion thereof the circuit board plate. Accordingly, the plate first leg and the circuit board plate essentially close the opening in the housing when the plate and circuit board are mounted in the housing.

In accordance with the preferred embodiment of the invention, the first contact means comprises a connector receptacle mounted on the first leg of the plate facing the second leg, and the second contact means comprises a connector plug mounted on the circuit board facing in the direction of the circuit board plate.

In accordance with another aspect of the invention, the housing comprises a flange extending about the opening and a removable end cap is provided extending about the flange which covers the first leg and the circuit board plate, and means are provided for removably fastening the end cap to the flange. The end cap contacts the circuit board plate when it is fastened to the housing.

In accordance with still another aspect of the invention, a protective device such as a switch is provided which is adapted to change the state of its electrical contact upon at least the partial disassembly of the apparatus. In the preferred embodiment, the protective switch comprises contact means mounted on the first leg and plunger means mounted on the cap which engage the contact means on the first leg, removal of the cap from the housing disengaging the plunger means from the contact means and changing the state of electrical contact of the switch. A transformer is preferably mounted on the mounting member and first and second pairs of contacts of the switch are provided in which the first pair of contacts is adapted to being connected to terminals of an input such as a source of power or to a measurement variable, etc., and the second pair of contacts is connected to the primary winding of the transformer. Engagement of the plunger means with the contact means connects the input to the transformer primary. Removal of the cap disengages the plunger means and contact means and separates respective contacts of the first and second pairs of contacts to break the connection therebetween whereby the input to the transformer is disconnected and the primary winding thereof is short circuited. Thus, power or a voltage for example, can be disconnected from electrical components in the housing upon removal of the cap.

As described hereinbefore, electrical components are mounted on the U-shaped mounting plate externally of the housing and the plate is fastened, preferably removably, in the housing. One leg of the plate forms part of the front panel of the apparatus and the other leg facing the rear of the housing preferably has mounted thereon wiring terminals and a contact arrangement for receiving the plug arrangement of the circuit board. The end plate fastened to the circuit board forms another part of the front panel.

The apparatus according to the invention has the advantage that all its electrical components are mounted either on the U-shaped mounting plate or on the circuit board, so that they can be assembled outside the housing, which makes assembly costs relatively low. After the electrical components are fastened to the mounting plate, the mounting plate is fastened as a unit in the housing. This can be accomplished simply, for example, by screw connections. Because the U-shaped mounting plate also carries wiring terminals of the apparatus and the contact arrangement for receiving the plug arrangement of the circuit board, no further assembly is required in the housing. Unlike known apparatus in which the front panel must be separately assembled to the housing, this additional assembly is eliminated according to the present invention since one leg of the U-shaped mounting plate and the end plate of the circuit board form the front panel upon mounting of the plate end circuit board in the housing. The apparatus may be simply disassembled by reversing the foregoing. The apparatus according to the invention is therefore not only easy to assemble but also easy to disassemble and service.

The apparatus according to the invention may incorporate the protective device or switch for safety and to prevent tampering or unauthorized disassembly. Additionally, the protective cap may be fastened to the front of the housing making contact with the end plate of the circuit board. By suitably fastening the protective cap, unauthorized persons can be prevented from tampering with the apparatus. This safety feature can reduce manufacturing costs of apparatus according to the invention since expensive insulation of electrical components can be avoided.

These and other aspects of the present invention will be more apparent from the following description of the preferred embodiment thereof when considered with the accompanying drawings and appended claims.

BRIEF DESCRIPTION OF THE DRAWINGS

The invention is illustrated by way of example and not limitation in the figures of the accompanying drawings in which like references indicate similar parts and in which.

DESCRIPTION OF THE PREFERRED EMBODIMENT

Figure 1:
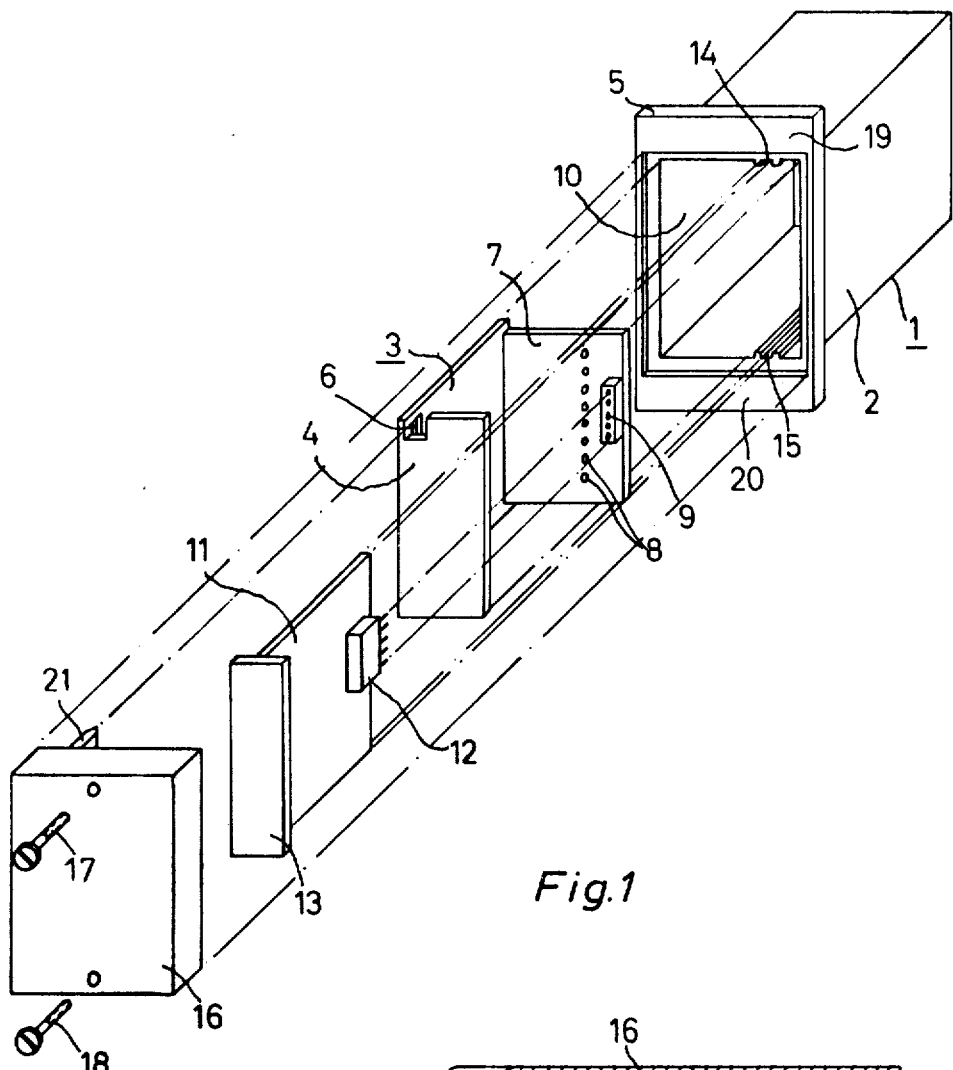
FIG. 1 is an exploded perspective view of the apparatus according to the invention showing various parts thereof.

Referring more particularly to the drawings, apparatus 1 comprises a housing 2 having a frontal opening. A U-shaped mounting plate or member 3 is removably mounted in the housing through the opening. The U-shaped mounting plate 3 has a leg 4 which, in the assembled configuration of the apparatus, lies in the frontal plane 5 of the housing 2 and forms part of the front panel of the apparatus. A recess is provided which receives the leg 4 to close part of the opening in the housing. A switch 6 is fastened to leg 4 of the mounting plate 3. The other leg 7, of the mounting plate 3, which faces the rear wall of the housing 2, is provided with terminals 8 and also carries a connector receptacle 9. The mounting plate 3 is, for example, screwed to a wall 10 of the housing 2.

The apparatus 1 further comprises a circuit board 11 with additional electrical components mounted thereon which are not shown for the sake of greater clarity. Circuit board 11 also has mounted thereon at one end thereof connector plug 12. The plug 12 mates with the receptacle 9 when the circuit board is inserted in the housing to engage the plug and receptacle and connect respective contacts thereof. The circuit board 11 is further provided with an end plate 13 secured to the end of the board opposed to the end on which the plug is secured. Plate 13 is also received in the recess so that together with the leg 4 of the mounting plate 3, they form the front panel of the electrical apparatus when the circuit board 11 is inserted into the housing 2. Guide elements 14 and 15 are provided on walls of housing 2 to guide the circuit board and cooperate to mount the circuit board in the housing.

Figure 2:
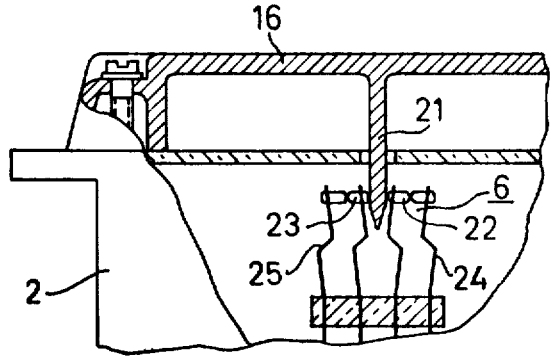
FIG. 2 is a partial cross section of the apparatus of FIG. 1 taken through the protective cap and showing the protective switch according to the invention.

The front panel of the electrical apparatus 1, formed by the leg 4 and the end plate 13, is covered by a protective cap 16, which is fastened by means of screws 17 and 18 to the flange parts 19 and 20 of the housing 2. The protective cap 16 has a non-electrically conductive plunger 21 as shown particularly in FIG. 2 which engages switch contacts 22 and 23 and connects these contacts respectively to contacts 24 and 25 when the protective cap is fastened to the housing. When the protective cap is removed, plunger 21 no longer engages and spreads contacts 22 and 23 and they therefore do not make contact with contacts 24 and 25. For example, the primary winding of a current transformer (not shown) which may be mounted in the housing 2 on the mounting plate 3 can be connected to contacts 22 and 23, and contacts 24 and 25 can be connected to an input such as a measurement variable or a source of power. Thus, when cap 16 is fastened to the housing as shown in FIG. 2, the primary winding is open and the other electrical components of apparatus 1 can be supplied with, for example, the measurement variable. If the protective cap 16 is removed, only the contacts 22 and 23 are closed, whereby the current transformer is shorted on the primary side and the measurement variable is disconnected therefrom because the contacts 22 and 24 as well as contacts 23 and 25 are open.

Thus, in accordance with the invention, apparatus is provided which is characterized by being particularly easy to assemble and service and which may incorporate a protective device or switch therein.

The advantages of the present invention, as well as certain changes and modifications of the disclosed embodiment thereof, will be readily apparent to those skilled in the art. It is the applicants' intention to cover by their claims all those changes and modifications which could be made to the embodiment of the invention herein chosen for the purposes of the disclosure without departing from the spirit and scope of the invention.

What is claimed is:

1. Apparatus for housing electrical components comprising:
- a housing having opposed first and second ends, said first end having an opening therein;
- guide means disposed in said housing for guiding at least one circuit board inserted through said opening;
- a mounting member retained within said housing adapted to receive electrical components to be mounted thereon, said mounting member including a first leg adapted to be received in a portion of said opening;
- at least one circuit board removably insertable in said housing in cooperation with said guide means, said circuit board being adapted to receive electrical components to be mounted thereon and including a plate mounted on an end thereof adapted to be received in the remainder of said opening whereby said first leg of said mounting member and said plate of said circuit board essentially close said opening when received therein; and
- electrical contact means mounted on said mounting member and said circuit board adapted to mate upon insertion of said circuit board in said housing.

2. The apparatus as recited in claim 1, wherein said mounting member comprises a generally U-shaped plate having a second leg opposed to said first leg and a central portion connecting the legs, said electrical contact means comprising first and second mating contact means, said first contact means being mounted on said circuit board proximate one end thereof and said second contact means being mounted on said second leg of said plate, said U-shaped plate being retained in said housing with said second leg proximate said second end of said housing.

3. The apparatus as recited in claim 2, wherein said first end has a recess extending about said opening which receives in a portion thereof said first leg of said plate and said circuit board plate.

4. The apparatus as recited in claim 1, wherein said first contact means comprises a connector receptacle mounted on said first leg facing said second leg and said second contact means comprises a connector plug mounted on said circuit board facing in the direction of said first end of said circuit board.

5. The apparatus as recited in claim 1, wherein said housing further comprises a flange extending about said opening, said apparatus further comprising a removable end cap extending about said flange which covers said first leg and said circuit board plate and means for removably fastening said end cap to said flange.

6. The apparatus as recited in claims 1 or 4 and further comprising a protective switch adapted to change the state of its electrical contact upon at least the partial disassembly of said apparatus.

7. The apparatus as recited in claim 5 and further comprising a protective switch adapted to change the state of its electrical contact upon removal of said cap, said switch comprising contact means mounted on said first leg and plunger means mounted on said cap whereupon removal of said cap from said housing changes the state of electrical contact of said switch.

8. The apparatus as recited in claim 7, and comprising a transformer mounted on said mounting member, said protective switch including first and second parts of contacts, the first pair of contacts being adapted to being connected to an input and the second pair of contacts being adapted to being connected to the primary winding of said transformer, removal of said cap being adapted to separate respective contacts of said first and second pairs of contacts to break the connection therebetween whereby the input is disconnected from the primary winding and the primary winding is short circuited.

9. The apparatus as recited in claim 1, and comprising electrical terminals mounted on said mounting member.

10. The apparatus as recited in claim 1, wherein said mounting member is removably retained in said housing by fastening means.

11. The apparatus as recited in claim 5, wherein said end cap contacts said circuit board plate.

12. Apparatus for housing electrical components comprising:
- a housing having opposed first and second ends, said first end having an opening therein and a recess extending about said opening;
- guide means disposed in said housing for guiding at least one circuit board inserted through said opening;
- a mounting member retained within said housing adapted to receive electrical components to be mounted thereon, said mounting member comprising a generally U-shaped plate having first and second opposed legs and a central portion connecting the legs;
- at least one circuit board removably insertable in said housing in cooperation with said guide means, said circuit board being adapted to receive electrical components to be mounted thereon and including a plate mounted on an end thereof opposed to said first end of said circuit board, said recess receiving in a portion thereof said first leg of said U-shaped plate, and in the remaining portion thereof said circuit board plate, whereby said first leg and said circuit board plate essentially close said opening; and
- electrical contact means mounted on said mounting member and said circuit board adapted to mate upon insertion of said circuit board in said housing, said electrical contact means comprising first and second mating contact means, said first contact means being mounted on said circuit board proximate one end thereof and said second contact means being mounted on said second leg of said plate, said plate being retained in said housing with said second leg proximate said second end of said housing;
- whereby essentially all electrical components to be housed in said housing may be mounted externally thereof on said mounting member and circuit board.

13. Apparatus for housing electrical components comprising:
- a housing having opposed first and second ends, said first end having an opening therein;
- guide means disposed in said housing for guiding at least one circuit board inserted through said opening;
- a mounting member retained within said housing adapted to receive electrical components to be mounted thereon, said mounting member comprising a generally U-shaped plate having first and second opposed legs and a central portion connecting the legs;
- at least one circuit board removably insertable in said housing in cooperation with said guide means, said circuit board being adapted to receive electrical components to be mounted thereon, and including a plate mounted on an end thereof opposed to said first end of said circuit board, said opening receiving in a portion thereof said first leg of said U-shaped plate, and in the remaining portion thereof said circuit board plate, whereby said first leg and said circuit board plate essentially close said opening; and electrical contact means mounted on said mounting member and said circuit board adapted to mate upon insertion of said circuit board in said housing, said electrical contact means comprising first and second mating contact means, said first contact means being mounted on said circuit board proximate one end thereof and said second contact means being mounted on said second leg of said plate, said plate being retained in said housing with said second leg proximate said second end of said housing;

whereby essentially all electrical components to be housed in said housing may be mounted externally thereof on said mounting member and circuit board.

* * * * *